United States Patent
Uchida et al.

(10) Patent No.: US 8,854,876 B2
(45) Date of Patent: Oct. 7, 2014

(54) PERPENDICULAR MAGNETIZATION STORAGE ELEMENT AND STORAGE DEVICE

(75) Inventors: Hiroyuki Uchida, Kanagawa (JP); Masanori Hosomi, Tokyo (JP); Hiroyuki Ohmori, Kanagawa (JP); Kazuhiro Bessho, Kanagawa (JP); Yutaka Higo, Kanagawa (JP); Tetsuya Asayama, Tokyo (JP); Kazutaka Yamane, Kanagawa (JP)

(73) Assignee: Sony Corporation, Tokyo (JP)

( * ) Notice: Subject to any disclaimer, the term of this patent is extended or adjusted under 35 U.S.C. 154(b) by 105 days.

(21) Appl. No.: 13/462,538

(22) Filed: May 2, 2012

(65) Prior Publication Data
US 2012/0300542 A1    Nov. 29, 2012

(30) Foreign Application Priority Data
May 23, 2011   (JP) .................... 2011-114440

(51) Int. Cl.
G11C 11/14 (2006.01)
H01L 43/08 (2006.01)
H01L 27/22 (2006.01)
G11C 11/16 (2006.01)

(52) U.S. Cl.
CPC .............. *G11C 11/161* (2013.01); *H01L 43/08* (2013.01); *H01L 27/226* (2013.01)
USPC ......................................... 365/171; 365/158

(58) Field of Classification Search
USPC ................................ 365/158, 171
See application file for complete search history.

(56) References Cited

U.S. PATENT DOCUMENTS

| | | | |
|---|---|---|---|
| 6,621,667 B1 * | 9/2003 | He et al. .................... | 360/324.12 |
| 2005/0008849 A1 * | 1/2005 | Kagami et al. ............... | 428/328 |
| 2009/0251951 A1 * | 10/2009 | Yoshikawa et al. .......... | 365/158 |
| 2010/0096716 A1 * | 4/2010 | Ranjan et al. ............... | 257/421 |
| 2011/0032644 A1 * | 2/2011 | Watts et al. ............... | 360/324.12 |
| 2012/0155154 A1 * | 6/2012 | Shukh ........................ | 365/158 |
| 2012/0155156 A1 * | 6/2012 | Watts et al. ............... | 365/158 |

FOREIGN PATENT DOCUMENTS

| | | |
|---|---|---|
| JP | 2004-193595 | 7/2004 |
| JP | 2009-081215 | 4/2009 |

OTHER PUBLICATIONS

Ikeda et al., "A perpendicular-anisotropy CoFeB—MgO magnetic tunnel junction," Nature Materials, vol. 9, Sep. 2010, pp. 721-724, published online Jul. 11, 2010. (4 pages).

* cited by examiner

*Primary Examiner* — Hoai V Ho
(74) *Attorney, Agent, or Firm* — K&L Gates LLP

(57) ABSTRACT

A storage element includes a storage layer which has magnetization perpendicular to its film surface and which retains information by a magnetization state of a magnetic substance, a magnetization pinned layer having magnetization perpendicular to its film surface which is used as the basis of the information stored in the storage layer, an interlayer of a non-magnetic substance provided between the storage layer and the magnetization pinned layer, and a cap layer which is provided adjacent to the storage layer at a side opposite to the interlayer and which includes at least two oxide layers. The storage element is configured to store information by reversing the magnetization of the storage layer using spin torque magnetization reversal generated by a current passing in a laminate direction of a layer structure including the storage layer, the interlayer, and the magnetization pinned layer.

4 Claims, 7 Drawing Sheets

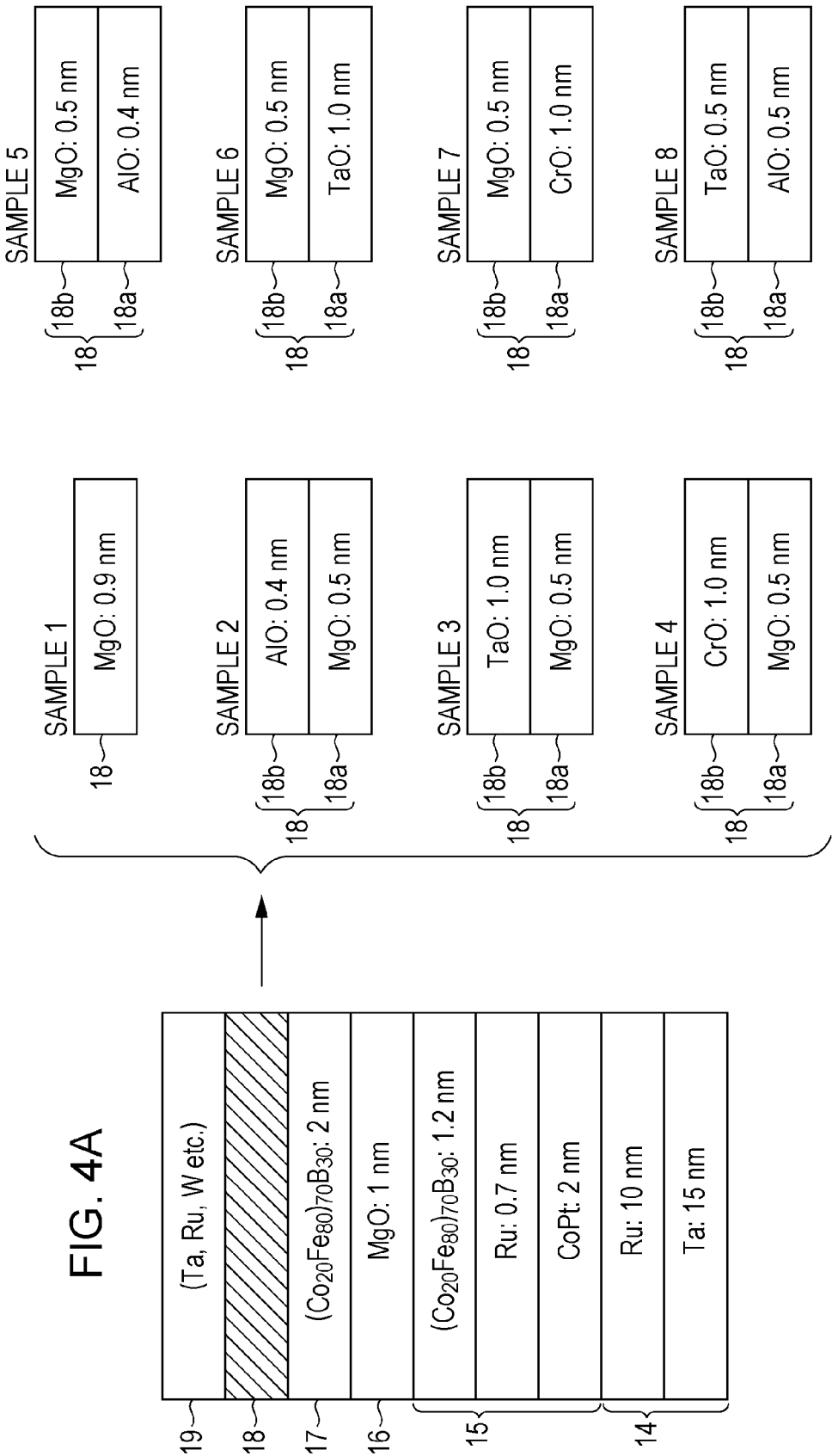

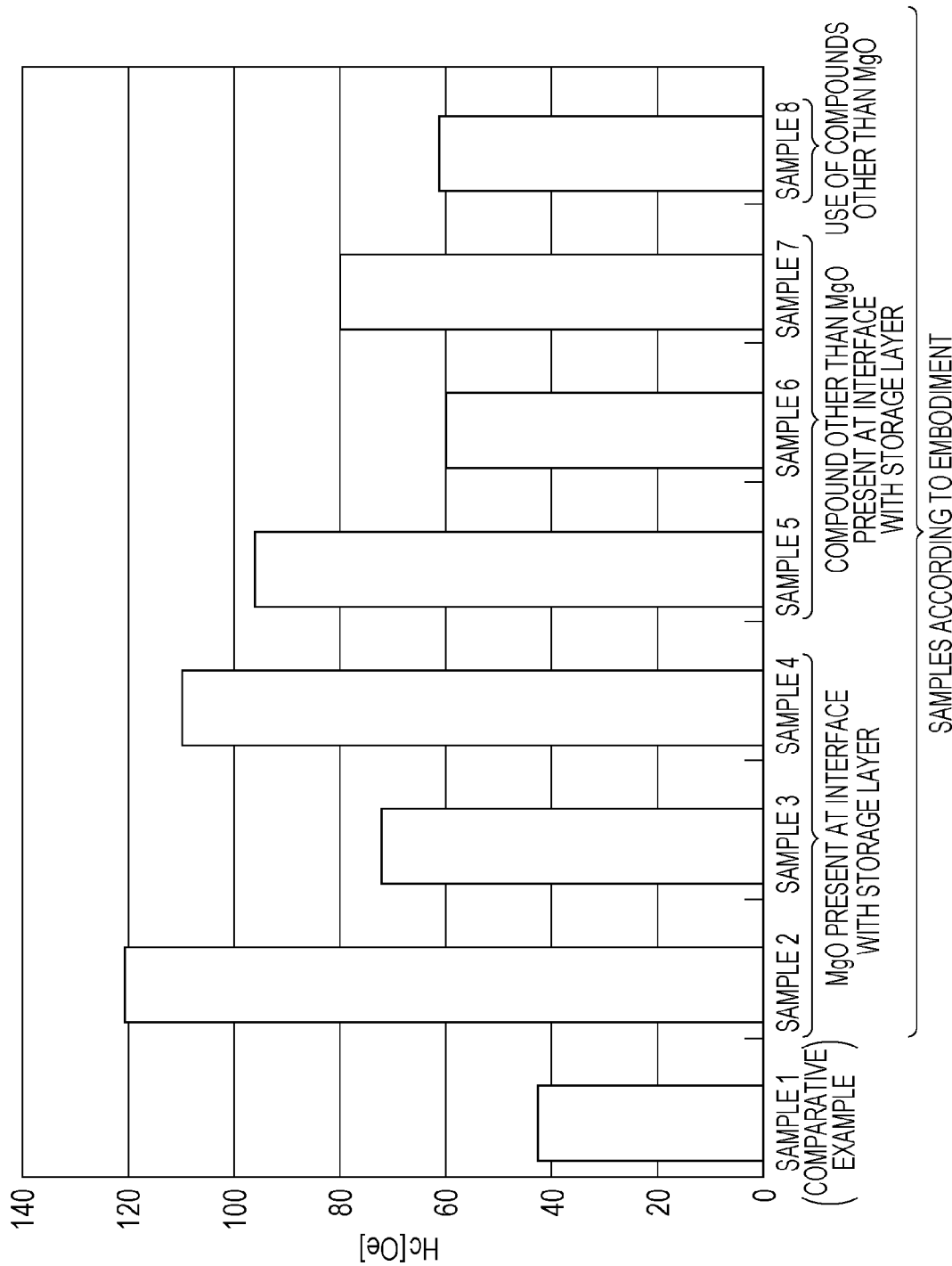

FIG. 7

PROPERTIES OF MAGNETORESISTANCE ELEMENT
AFTER HEAT TREATMENT AT 300°C

|  | TMR[%] | Hc[Oe] | Δ | JcO[MA/cm$^2$] | |
|---|---|---|---|---|---|
| SAMPLE 9 | 64 | 650 | 47 | 4.6 | COMPARATIVE EXAMPLE |
| SAMPLE 10 | 60 | 1000 | 65 | 4.9 | SAMPLES ACCORDING TO EMBODIMENT |
| SAMPLE 11 | 56 | 800 | 53 | 4.7 | |

PERPENDICULAR MAGNETIZATION STORAGE ELEMENT AND STORAGE DEVICE

CROSS REFERENCES TO RELATED APPLICATIONS

The present application claims priority to Japanese Priority Patent Application JP 2011-114440 filed in the Japan Patent Office on May 23, 2011, the entire content of which is hereby incorporated by reference.

BACKGROUND

The present disclosure relates to a storage element that has a storage layer which stores a magnetization state of a ferromagnetic layer as information and a magnetization pinned layer in which the direction of magnetization is pinned and that changes the direction of magnetization of the storage layer by passing a current and to a storage device including this storage element.

Concomitant with significant developments of various information apparatuses including large capacity servers, mobile terminals, and the like, elements, such as memories and logics, forming those apparatuses are also requested to improve performance, such as increase in integration degree, increase in operation speed, and reduction in power consumption. In particular, advancement in non-volatile semiconductor memories has been remarkable, and above all, flash memories each functioning as a large capacity file memory have been increasingly in demand so as to replace hard disk drives.

In addition, in consideration of expansion into code storages and working memories, development of ferroelectric random access memories (FeRAMs), magnetic random access memories (MRAMs), phase-change random access memories (PCRAMs), and the like has been pursued in order to replace NOR flash memories, DRAMs, and the like, which are now commonly used, and some of those memories mentioned above have been already put into practical use.

In particular, since data is stored using the magnetization direction of a magnetic material, the MRAM is capable of performing high-speed and almost-infinite ($10^{15}$ times or more) rewriting operations and has already been used in the fields of industrial automation, airplane, and the like.

Because of its high-speed operation and high reliability, the MRAM is expected to be expanded into the code storage and the working memory in the future; however, in practice, there are problems to be overcome, such as reduction in power consumption and increase in capacity.

These mentioned above are intrinsic problems resulting from the recording principle of the MRAM, that is, resulting from the method in which magnetization reversal is performed by a current magnetic field generated from a wire. As one method to solve these problems mentioned above, a recording method using no current magnetic field (that is, a magnetization reversal method) has been studied, and in particular, researches on spin torque magnetization reversal have been actively performed.

A storage element of the spin torque magnetization reversal is formed using a magnetic tunnel junction (MTJ) as in the case of the MRAM and uses a phenomenon in which spin-polarized electrons passing through a magnetic layer pinned in a certain direction impart torque to another free magnetic layer (the direction of which is not pinned) when entering this free magnetic layer, and the magnetization of the free magnetic layer is reversed by passing a current equivalent to or more than a certain threefold value. Rewriting of 0/1 is performed by changing the polarity of the current.

The absolute value of the current for this reversal is 1 mA or less in an element having a scale of approximately 0.1 μm.

In addition, scaling can be performed because this current value decreases in proportion to the element volume. Furthermore, since a word line for generating a current magnetic field for recording, which is necessary for the MRAM, is not necessary in this case, the cell structure can be advantageously simplified.

Hereinafter, the MRAM using the spin torque magnetization reversal will be referred to as the "spin torque-magnetic random access memory (ST-MRAM)". The spin torque magnetization reversal may also be referred to as the spin injection magnetic reversal in some cases.

The ST-MRAM has been greatly expected as a non-volatile memory that can realize reduction in power consumption and increase in capacity while maintaining advantages of the MRAM, such as a high-speed operation and an almost infinite rewriting number.

As the ST-MRAM, a memory using in-plane magnetization as disclosed, for example, in Japanese Unexamined Patent Application Publication No. 2004-193595 and a memory using perpendicular magnetization as disclosed, for example, in Japanese Unexamined Patent Application Publication No. 2009-81215 have been developed.

SUMMARY

Although various materials have been examined as a ferromagnetic substance used for the ST-MRAM, in general, it has been believed that a material having perpendicular magnetic anisotropy is suitable for reduction in power consumption and increase in capacity as compared to a material having in-plane magnetic anisotropy.

The reason for this is that an energy barrier to be surpassed in the spin torque magnetization reversal is low for perpendicular magnetization, and high magnetic anisotropy of a perpendicular magnetization film advantageously maintains thermal stability of a storage carrier miniaturized for increase in capacity.

However, depending on a magnetic material having perpendicular anisotropy, the anisotropy energy thereof is low, and the property of retaining information as a storage element may be a concern in some cases.

Accordingly, it is desirable to provide a ST-MRAM element which realizes high information-retention property as a storage element by further enhancing the perpendicular magnetic anisotropy and which can also stably perform recording at a low current.

A storage element according to an embodiment of the present disclosure includes: a storage layer which has magnetization perpendicular to its film surface and which retains information by a magnetization state of a magnetic substance; a magnetization pinned layer having magnetization perpendicular to its film surface which is used as the basis of the information stored in the storage layer; an interlayer of a non-magnetic substance provided between the storage layer and the magnetization pinned layer; and a cap layer which is provided adjacent to the storage layer at a side opposite to the interlayer and which includes at least two oxide layers. This storage element is configured to store information by reversing the magnetization of the storage layer using spin torque magnetization reversal generated by a current passing in a laminate direction of a layer structure including the storage layer, the interlayer, and the magnetization pinned layer.

A storage device according to an embodiment of the present disclosure includes: a storage element which retains information by a magnetization state of a magnetic substance; and two types of wires intersecting each other. In this storage device, the storage element includes: a storage layer which has magnetization perpendicular to its film surface and which retains information by a magnetization state of a magnetic substance; a magnetization pinned layer having magnetization perpendicular to its film surface which is used as the basis of the information stored in the storage layer; an interlayer of a non-magnetic substance provided between the storage layer and the magnetization pinned layer; and a cap layer which is provided adjacent to the storage layer at a side opposite to the interlayer and which includes at least two oxide layers. In addition, the storage element is configured to store information by reversing the magnetization of the storage layer using spin torque magnetization reversal generated by a current passing in a laminate direction of a layer structure including the storage layer, the interlayer, and the magnetization pinned layer. Furthermore, in this storage device, the storage element is arranged between the two types of wires, and the current in a laminate direction passes in the storage element through the two types of wires, so that the spin torque magnetization reversal occurs.

In the above technique of the present disclosure, as the ST-MRAM, the storage layer, the interlayer (tunnel barrier layer), and the magnetization pinned layer form a MTJ structure. Furthermore, the cap layer located adjacent to the storage layer includes at least two oxide layers.

Since the cap layer is formed to have an oxide laminate structure, the perpendicular magnetic anisotropy can be enhanced as compared to that of the structure using a single layer oxide.

According to the technique of the present disclosure, as a non-volatile memory by a perpendicular magnetization type ST-MRAM, the perpendicular magnetic anisotropy is enhanced, and hence high information retention property (thermal stability) can be realized as a storage element. Accordingly, a ST-MRAM storage element capable of stably performing recording at a low current and a storage device using the same can be realized.

Additional features and advantages are described herein, and will be apparent from the following Detailed Description and the figures.

BRIEF DESCRIPTION OF THE FIGURES

FIGS. 4A and 4B are views each illustrating a sample of Experiment 1 according to an embodiment;

FIG. 5 is a graph showing a coercive force as the result of Experiment 1;

FIG. 7 is a table showing the result of Experiment 2.

DETAILED DESCRIPTION

Hereinafter, embodiments of the present disclosure will be described in the following order.
<1. Structure of storage device according to embodiment>
<2. Outline of storage element according to embodiment>
<3. Concrete structure according to embodiment>
<4. Experiments according to embodiment>

1. STRUCTURE OF STORAGE DEVICE ACCORDING TO EMBODIMENT

First, the structure of a storage device according to an embodiment of the present disclosure will be described.

Figure 1:
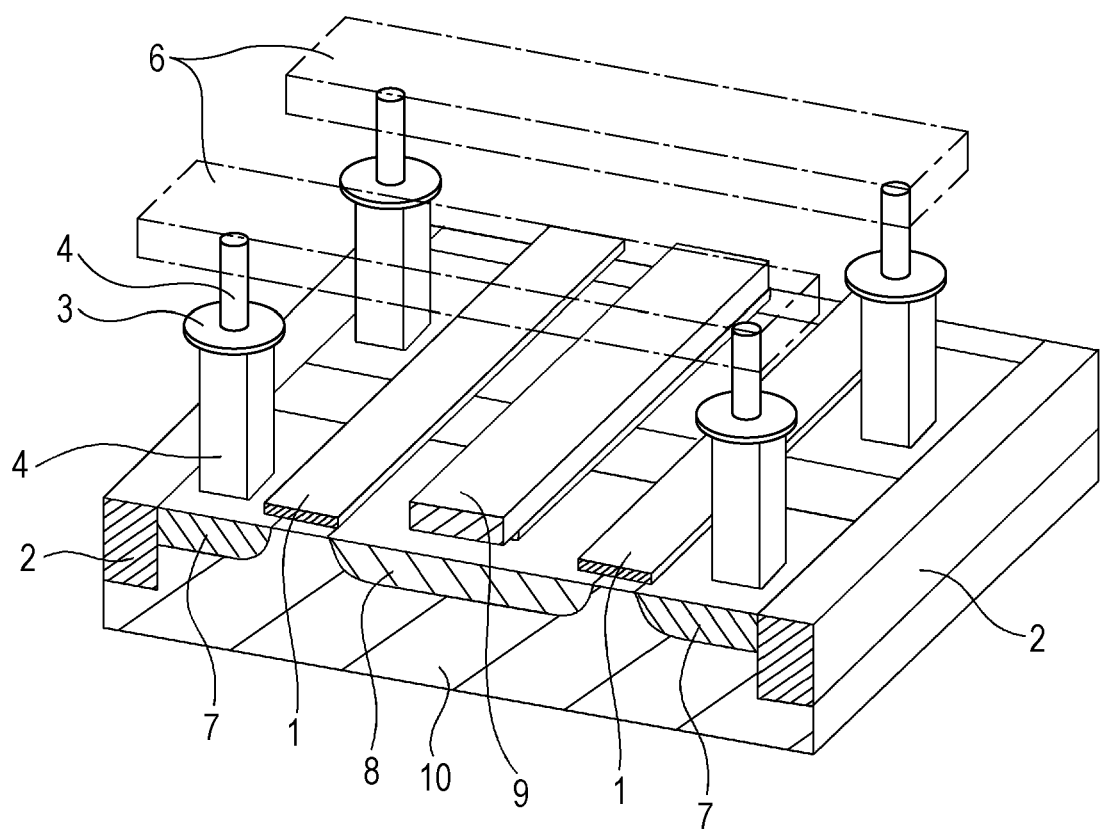
FIG. 1 is a schematic perspective view of the structure of a storage device according to an embodiment.
Figure 2:
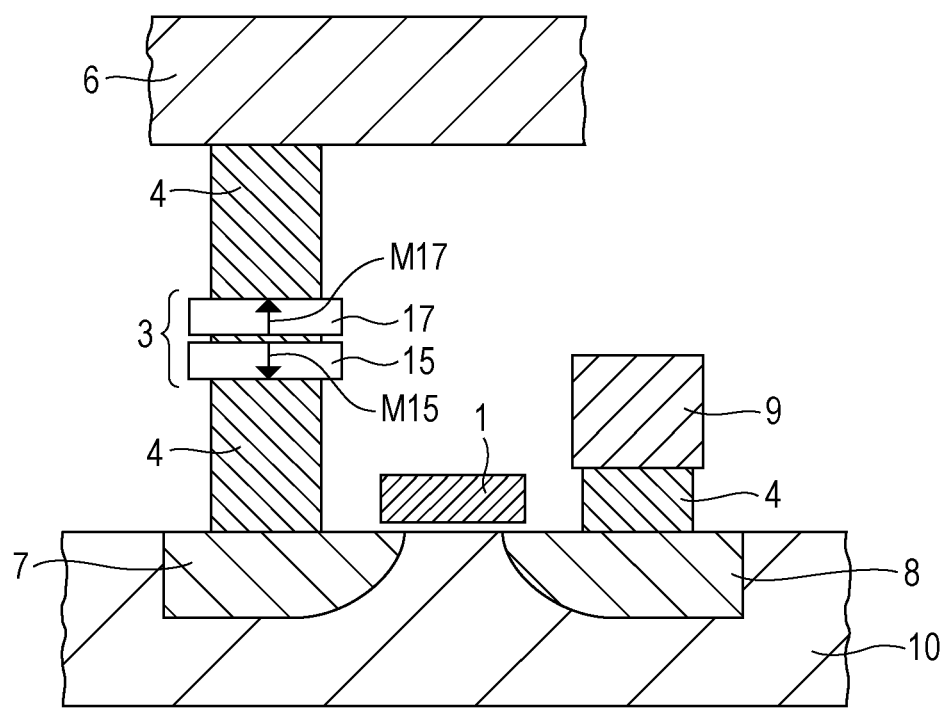
FIG. 2 is a cross-sectional view of the storage device according to the embodiment.

Schematic views of the storage device according to the embodiment are shown in FIGS. 1 and 2. FIG. 1 is a perspective view, and FIG. 2 is a cross-sectional view.

As shown in FIG. 1, in the storage device according to the embodiment, a storage element 3 of a ST-MRAM which can retain information by a magnetization state is arranged in the vicinity of the intersection of two types of address lines (such as a word line and a bit line) perpendicularly intersecting each other.

That is, a drain region 8, a source region 7, and a gate electrode 1, which form a selection transistor for selecting each storage device, are formed in an area isolated by an element isolation layer 2 of a semiconductor substrate 10, such as a silicon substrate. Among these mentioned above, the gate electrode 1 also functions as one of the address lines (word lines) extending in a front-back direction in this figure.

The drain region 8 is formed in common for the two selection transistors located at a right and a left side in FIG. 1, and a wire 9 is connected to this drain region 8.

In addition, the storage element 3 having a storage layer in which the direction of magnetization is reversed by spin torque magnetization reversal is arranged between the source region 7 and a bit line 6 provided thereabove and extending in a right-left direction in FIG. 1. This storage element 3 is formed, for example, of a magnetic tunnel junction element (MTJ element).

As shown in FIG. 2, the storage element 3 has two magnetic layers 15 and 17. Of the two magnetic layers 15 and 17, one magnetic layer is used as a magnetization pinned layer 15 in which the direction of magnetization M15 is pinned, and the other magnetic layer is used as a magnetic free layer 17, that is, a storage layer 17, in which the direction of magnetization M17 is changed.

In addition, the storage element 3 is connected to the bit line 6 and the source region 7 through respective top and bottom contact layers 4.

Accordingly, when a current is passed in the storage element 3 in a top-bottom direction through the two types of address lines 1 and 6, the direction of the magnetization M17 of the storage layer 17 can be reversed by the spin torque magnetization reversal.

In the storage device as described above, it has been well understood that writing is necessarily performed at a current equivalent to or less than a saturation current of the selection transistor, and that the saturation current thereof is decreased as the transistor is miniaturized. Accordingly, for miniaturization of the storage device, the current to be passed in the storage element 3 is preferably decreased by improving the efficiency of spin transfer.

In addition, in order to increase the intensity of a read signal, it is necessary to ensure a high rate of change in magnetoresistance, and hence, the use of the MTJ structure as described above is effective, that is, the storage element 3 in which the interlayer functioning as a tunnel insulating layer (tunnel barrier layer) is provided between the two magnetic layers 15 and 17 is effectively used.

When the tunnel insulating layer is used as the interlayer as described above, in order to prevent dielectric breakdown of the tunnel insulating layer, the current to be passed in the storage element 3 is restricted. That is, in order to ensure the reliability for repeated writing in the storage element 3, the current necessary for the spin torque magnetization reversal is also preferably suppressed. In addition, the current necessary for the spin torque magnetization reversal may also be called, for example, a reverse current or a storage current in some cases.

In addition, since the storage device is a non-volatile memory device, it is necessary to stably store information written by a current. That is, it is necessary to ensure the stability (thermal stability) against heat fluctuation of the magnetization of the storage layer.

If the thermal stability of the storage layer is not ensured, the direction of reversed magnetization may be again reversed with heat (temperature in operating environment) in some cases, and a writing error may occur.

In the storage element 3 (ST-MRAM) of this storage device, although the scaling can be advantageously performed, that is, the volume can be decreased, as compared to a related MRAM, when the volume is decreased, the thermal stability tends to be degraded if the other properties are not changed.

When the capacity of the ST-MRAM is increased, since the volume of the storage element 3 is further decreased, to ensure the thermal stability becomes an important subject.

Therefore, in the storage element 3 of the ST-MRAM, the thermal stability is a significantly important property, and even if the volume thereof is decreased, design has to be performed to ensure this thermal stability.

2. OUTLINE OF STORAGE ELEMENT ACCORDING TO EMBODIMENT

Next, the outline of the storage element according to an embodiment of the present disclosure will be described.

The storage element according to the embodiment is formed as a ST-MRAM. By the spin torque magnetization reversal, the ST-MRAM reverses the direction of the magnetization of the storage layer of the storage element to store information.

The storage layer is formed of a magnetic substance containing a ferromagnetic layer and is configured to retain information by a magnetization state (direction of magnetization) of the magnetic substance.

Although described later in detail, the storage element 3 according to the embodiment has, for example, a layer structure shown in FIG. 3 and includes at least two ferromagnetic layers, the storage layer 17 and the magnetization pinned layer 15, and an interlayer 16 provided therebetween.

The storage layer 17 has magnetization perpendicular to its film surface, and the direction of the magnetization is changed corresponding to information.

The magnetization pinned layer 15 has magnetization perpendicular to its film surface which is used as the basis of the information stored in the storage layer 17.

The interlayer 16 is formed from an insulating layer, for example, of a non-magnetic substance and is provided between the storage layer 17 and the magnetization pinned layer 15.

In addition, by injecting spin-polarized electrons in a laminate direction of a layer structure including the storage layer 17, the interlayer 16, and the magnetization pinned layer 15, the direction of the magnetization of the storage layer 17 is changed, and information is stored in the storage layer 17.

The spin torque magnetization reversal will be briefly described.

Electrons have two types of spin angular momenta. These electrons are temporarily defined as upward and downward electrons. Inside a non-magnetic substance, the number of the upward electrons is equal to that of the downward electrons, and inside a ferromagnetic substance, the number of the upward electrons is different from that of the downward electrons. In the magnetization pinned layer 15 and the storage layer 17, which are the two ferromagnetic layers forming the storage element 3, the case in which electrons are transferred from the magnetization pinned layer 15 to the storage layer 17 will be discussed when the directions of the magnetic moments of the above ferromagnetic layers are in an antiparallel state.

The magnetization pinned layer 15 is a pinned magnetic layer in which the direction of the magnetic moment is pinned by a high coercive force.

Electrons passing through the magnetization pinned layer 15 are spin-polarized, that is, the number of upward electrons becomes different from that of downward electrons. When the thickness of the interlayer 16, which is a non-magnetic layer, is formed sufficiently small, before the spin polarization of electrons caused by passage thereof through the magnetization pinned layer 15 is relaxed, and the electrons are placed in a non-polarized state (in which the number of upward electrons is the same as that of downward electrons) in an ordinary non-magnetic substance, the electrons reach the other magnetic substance, that is, the storage layer 17.

Since the sign of the degree of spin polarization in the storage layer 17 is opposite, in order to decrease energy of the system, some of the electrons are reversed, that is, the directions of the spin angular momenta are reversed. At this time, since the total angular momentum of the system should be conserved, the reaction equivalent to the total of the change in angular momentum of electrons, the direction of each of which is changed, is also imparted to the magnetic moment of the storage layer 17.

When the current is low, that is, when the number of electrons passing per unit time is small, since the total number of electrons, each of which changes its direction, is also small, the change in angular momentum generated in the magnetic moment of the storage layer 17 is small; however, when the current is increased, a larger change in angular momentum can be imparted per unit time.

The change in angular momentum with time is the torque, and if the torque exceeds a certain threshold value, the magnetic moment of the storage layer 17 starts a precession motion and is stabilized after rotated by 180° because of its uniaxial magnetic anisotropy. That is, reversal occurs from an antiparallel state to a parallel state.

When the magnetizations are in a parallel state, conversely, if current is then passed in a direction such that electrons are transferred from the storage layer 17 to the magnetization pinned layer 15, the torque is imparted to the storage layer 17 when electrons spin-polarized by reflection at the magnetization pinned layer 15 enter the storage layer 17; hence, the magnetic moment can be reversed to an antiparallel state. However, in this case, the current necessary to cause this reversal is large as compared to that for the reversal from an antiparallel state to a parallel state.

Although it is difficult to intuitively understand the reversal of the magnetic moments from a parallel state to an antiparallel state, this mechanism may be considered in such a way that since the magnetization pinned layer 15 is pinned, the magnetic moment is be reversed, and in order to conserve the angular momentum of the entire system, the magnetization of the storage layer 17 is reversed. As described above, 0/1 is stored by passing a current equivalent to or larger than a certain threshold value in the direction from the magnetization pinned layer 15 to the storage layer 17 or in the direction opposite thereto corresponding to each of the respective polarities.

Information can be read out using the magnetoresistance effect as in the case of a related MRAM. That is, as in the case of the above storage, a current is passed in a direction perpendicular to the film surface. In addition, a phenomenon is used in which depending on whether the magnetic moment of the storage layer 17 is in the same direction as that of the magnetic moment of the magnetization pinned layer 15 or is in a direction opposite thereto, the electric resistance of the element is changed.

Although either a metal or an insulating material may be used for the interlayer 16 provided between the magnetization pinned layer 15 and the storage layer 17, it is believed that when an insulating material is used for the interlayer, a higher read signal (rate of change in resistance) is obtained, and information can be stored at a lower current. The element as described above is called a ferromagnetic tunnel junction (Magnetic Tunnel Junction: MTJ).

When the direction of magnetization of a magnetic layer is reversed by the spin torque magnetization reversal, a necessary current threshold Ic is changed depending on whether the magnetization easy axis of the magnetic layer is in an in-plane direction or a direction perpendicular thereto.

Although the storage element of this embodiment is a perpendicular magnetization type, the reverse current which reverses the direction of magnetization of a magnetic layer of a related in-plane magnetization type storage element is represented by Ic_para.

When the parallel state is reversed to the antiparallel state (the parallel state and the antiparallel state are each determined by the magnetization direction of the storage layer on the basis of the magnetization direction of the magnetization pinned layer), $$Ic\_para = (A \cdot \alpha \cdot Ms \cdot V/g(0)/P)(Hk+2\pi Ms) \text{ holds.}$$

When the antiparallel state is reversed to the parallel state, $$Ic\_para = -(A \cdot \alpha \cdot Ms \cdot V/g(\pi)/P)(Hk+2\pi Ms) \text{ holds.}$$

On the other hand, if the reverse current of a perpendicular magnetization type storage element as that of this example is represented by Ic_perp, when the parallel state is reversed to the antiparallel state, $$Ic\_perp = (A \cdot \alpha \cdot Ms \cdot V/g(0)/P)(Hk-4\pi Ms) \text{ holds.}$$

When the antiparallel state is reversed to the parallel state, $$Ic\_perp = -(A \cdot \alpha \cdot Ms \cdot V/g(\pi)/P)(Hk-4\pi Ms) \text{ holds.}$$

In the above formulas, A represents a constant, α represents the damping constant, Ms represents the saturation magnetization, V represents the element volume, P represents the spin polarizability, g(0) and g(π) represent coefficients corresponding to the efficiency of transmission of spin torque to the counterpart magnetic layer in the parallel state and the antiparallel state, respectively, and Hk represents the magnetic anisotropy.

In each of the above formulas, if (Hk−4πMs) in the case of the perpendicular magnetization type is compared to (Hk+2πMs) in the case of the in-plane magnetization type, it is understood that the perpendicular magnetization type is more suitable for reduction in storage current.

As a magnetic material having perpendicular anisotropy, for example, a Co—Fe—B alloy may be mentioned, and in order to realize a high rate of change in magnetoresistance that imparts a large read signal in the ST-MRAM, the above material can be used together with MgO used as a tunnel barrier (interlayer 16); hence, the combination described above is promising.

However, in this structure which has interface anisotropy with an oxide as the origin of the perpendicular magnetic anisotropy, a low retention property (thermal stability) by lower perpendicular anisotropy energy than that of the other perpendicular magnetization materials is a concern.

In order to improve the retention property, although there are methods, such as an increase in volume of a magnetic layer, unfavorably, the trade-off in which the interface anisotropy is decreased as the thickness is increased is liable to occur.

When the storage element is used as a memory, information stored therein has to be retained.

As an index of the ability to retain information, the value of index Δ (=KV/$k_B$T) of the thermal stability is used for judgment. This Δ is represented by the following formula.

$$\Delta = KV/k_B T = Ms \cdot V \cdot Hk \cdot (1/2 k_B \cdot T)$$

In this formula, Hk represents the effective anisotropy field, $k_B$ represents the Boltzmann's constant, T represents the absolute temperature, Ms represents the saturation magnetization amount, V represents the volume of the storage layer 17, and K represents the anisotropy energy.

The influences of shape magnetic anisotropy, induced magnetic anisotropy, crystal magnetic anisotropy, and the like are incorporated in the effective anisotropy field Hk, and when the coherent rotation model in a single domain is assumed, this effective anisotropy field Hk becomes equivalent to the coercive force.

3. CONCRETE STRUCTURE ACCORDING TO EMBODIMENT

Next, a concrete structure according to an embodiment of the present disclosure will be described.

As described above with reference to FIG. 1, in the structure of the storage device, the storage element 3 capable of retaining information by a magnetization state is arranged in the vicinity of the intersection between the two types of address lines 1 and 6 (such as a word line and a bit line) perpendicularly intersecting each other.

In addition, when a current in a top-bottom direction is passed in the storage element 3 through the two types of address lines 1 and 6, the direction of the magnetization of the storage layer 17 can be reversed by the spin torque magnetization reversal.

Figure 3:
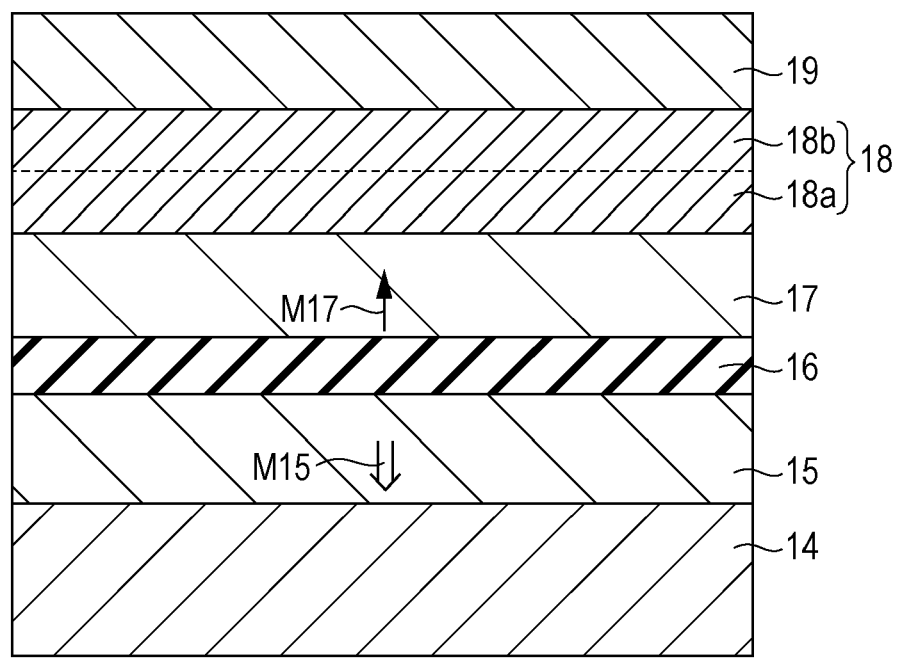
FIG. 3 is a cross-sectional view showing a layer structure of a storage element according to an embodiment.

FIG. 3 shows an example of the layer structure of the storage element 3 (ST-MRAM) according to the embodiment.

The storage element 3 has an underlayer 14, the magnetization pinned layer 15, the interlayer 16, the storage layer 17, an oxide cap layer 18, and a cap protective layer 19.

As the example shown in FIG. 3, in the storage element 3, the magnetization pinned layer 15 is provided under the storage layer 17 in which the direction of the magnetization M17 is reversed by the spin torque magnetization reversal.

In the ST-MRAM, the relative angle between the magnetization M17 of the storage layer 17 and the magnetization M15 of the magnetization pinned layer 15 prescribes 0 or 1 information.

The storage layer 17 is formed of a ferromagnetic substance having a magnetic moment in which the direction of the magnetization is freely changed in a direction perpendicular to its layer surface. The magnetization pinned layer 15 is formed of a ferromagnetic substance having a magnetic moment in which the magnetization is pinned in a direction perpendicular to its film surface.

Information is stored by the direction of the magnetization of the storage layer 17 having uniaxial anisotropy. Writing is performed by applying a current in the direction perpendicular to its film surface to cause the spin torque magnetization reversal. As described above, the magnetization pinned layer 15 is provided under the storage layer in which the direction of the magnetization is reversed by spin injection and is used as the basis of the stored information (magnetization direction) of the storage layer 17.

Between the storage layer 17 and the magnetization pinned layer 15, the interlayer 16 functioning as a tunnel barrier layer (tunnel insulating layer) is provided, and a MTJ element is formed by the storage layer 17 and the magnetization pinned layer 15.

In addition, the underlayer 14 is formed under the magnetization pinned layer 15.

The oxide cap layer 18 is formed on the storage layer 17 (that is, at a side opposite to the interlayer 16 when viewed from the storage layer 17).

Furthermore, the cap protective layer 19 is formed on the oxide cap layer 18 (that is, at a side opposite to the storage layer 17 when viewed from the oxide cap layer 18).

According to this embodiment, Co—Fe—B is used for the storage layer 17 and the magnetization pinned layer 15.

In addition, besides a Co—Fe—B alloy, a Co—Fe—C alloy, a Ni—Fe—B alloy, and a Ni—Fe—C alloy may also be used for a magnetic substance forming the storage layer 17 and the magnetization pinned layer 15.

Since the magnetization pinned layer 15 is used as the basis of information, the direction of the magnetization thereof should not be changed by recording and/or reading; however, the direction thereof is not necessarily pinned in a specific direction, and the coercive force, the thickness, or the magnetic damping constant of the magnetization pinned layer 15 may be increased larger than that of the storage layer 17 so that the direction of the magnetization thereof is not likely to move as compared to that of the storage layer 17.

The interlayer 16 (tunnel barrier layer) is formed, for example, of MgO. When a MgO (magnesium oxide) layer is formed, the rate of change in magnetoresistance (MR ratio) can be increased. When the MR ratio is increased as described above, the efficiency of spin injection is improved, and a current density necessary to reverse the direction of the magnetization M17 of the storage layer 17 can be decreased.

In addition, besides magnesium oxide, the interlayer 16 may also be formed from various insulating substances, such as aluminum oxide, aluminum nitride, $SiO_2$, $Bi_2O_3$, $MgF_2$, CaF, $SrTiO_2$, $AlLaO_3$, and Al—N—O, dielectric substances, and semiconductors.

As the underlayer 14 and the cap protective layer 19, various types of metals, such as Ta, Ti, W, and Ru, and conductive nitrides, such as TiN, may be used. In addition, the underlayer 14 and the protective layer 20 may be a single layer or may be formed by laminating layers of different materials.

In this example, the oxide cap layer 18 has a two-layer laminate structure including a first cap layer 18a and a second cap layer 18b.

The first cap layer 18a and the second cap layer 18b are each preferably formed as a layer of silicon oxide, magnesium oxide, tantalum oxide, aluminum oxide, cobalt oxide, ferrite, titanium oxide, chromium oxide, strontium titanate, lanthanum aluminum oxide, zinc oxide, or a mixture containing at least one of the oxides mentioned above.

In addition, the first cap layer 18a adjacent to the storage layer 17 is preferably a magnesium oxide layer.

Although the two-layer laminate structure of the first cap layer 18a and the second cap layer 18b is described in the example shown in FIG. 3, a laminate structure having at least three oxide layers may also be formed.

In particular, in this embodiment, the composition of the storage layer 17 is adjusted so that the intensity of an effective demagnetizing field, which is received by the storage layer 17, is smaller than the saturation magnetization amount Ms of the storage layer 17.

As described above, a ferromagnetic material having a Co—Fe—B composition is selected for the storage layer 17, and the intensity of the effective demagnetizing field, which is received by the storage layer 17, is decreased so as to be smaller than the saturation magnetization amount Ms of the storage layer. Accordingly, the magnetization of the storage layer 17 is directed in the direction perpendicular to its film surface.

Furthermore, in this embodiment, when the insulating layer forming the interlayer 16 is a magnesium oxide layer (MgO), the rate of change in magnetoresistance (MR ratio) can be increased. When the MR ratio is increased as described above, the efficiency of spin injection is improved, and the current density necessary to reverse the direction of the magnetization of the storage layer 17 can be decreased.

Since the storage layer 17 of the storage element 3 is formed so that the intensity of the effective demagnetizing field, which is received by the storage layer 17, is smaller than the saturation magnetization amount Ms of the storage layer 17, the demagnetizing field received by the storage layer is decreased, and a write current necessary to reverse the direction of the magnetization of the storage layer can be decreased. The reason for this is that since the storage layer 17 has perpendicular magnetic anisotropy, a reverse current of the perpendicular magnetization type ST-MRAM can be applied, and hence advantages can be obtained in view of the demagnetizing field.

On the other hand, since the write current can be decreased without decreasing the saturation magnetization amount Ms of the storage layer 17, while sufficient saturation magnetization amount Ms of the storage layer 17 is retained, the thermal stability of the storage layer 17 can be ensured.

Furthermore, in this embodiment, the oxide cap layer 18 including the two oxide layers is provided in contact with the storage layer 17.

By the oxide cap layer 18 having an oxide laminate structure thus provided, the perpendicular magnetic anisotropy can be adjusted, and the coercive force and the information retention property (thermal stability index $\Delta$) of the storage layer 17 can be enhanced as compared to those of the structure using a single oxide layer.

Hence, a storage element having excellent balance in properties can be formed.

In the storage element 3 of this embodiment, the layers from the underlayer 14 to the cap protective layer 19 are sequentially and successively formed in a vacuum apparatus, so that the laminate structure is obtained. Subsequently, the pattern of the storage element 3 is formed by processing, such as etching, so that the storage element 3 is manufactured.

In addition, the magnetization pinned layer 15 can be formed from a single ferromagnetic layer or can be formed to have a laminate ferri-pinned structure in which ferromagnetic layers are laminated with at least one non-magnetic layer provided therebetween.

As a material of the ferromagnetic layer which forms the magnetization pinned layer 15 having a laminate ferri-pinned structure, Co, CoFe, CoFeB, and the like may be used. In addition, for example, Ru, Re, Ir, and Os may be used as a material of the non-magnetic layer.

Alternatively, by using antiferromagnetic coupling between an antiferromagnetic layer and a ferromagnetic layer, the structure can be formed in which the direction of the magnetization is pinned.

As a material of the antiferromagnetic layer, for example, magnetic substances, such as a FeMn alloy, a PtMn alloy, a PtCrMn alloy, a NiMn alloy, an IrMn alloy, NiO, and $Fe_2O_3$ may be mentioned.

In addition, by addition of non-magnetic elements, such as Ag, Cu, Au, Al, Si, Bi, Ta, B, C, O, N, Pd, Pt, Zr, Hf, Ir, W, Mo, and Nb, to the above magnetic substances, the magnetic properties can be adjusted, and/or other various properties, such as the crystal structure, the crystallinity, and the stability of substances, can also be adjusted.

If the magnetization pinned layer 15 is formed to have a laminate ferri-pinned structure, the magnetization pinned layer 15 can be made insensitive to an external magnetic field and can block the leakage magnetic field caused by the magnetization pinned layer 15, and in addition, the perpendicular magnetic anisotropy of the magnetization pinned layer 15 can be enhanced by the interlayer coupling between the magnetic layers.

4. EXPERIMENTS ACCORDING TO EMBODIMENT

Experiment 1

This experiment evaluated the magnetic properties of the storage element 3 including the oxide cap layer 18 having an oxide laminate as shown in FIG. 3. Measurement of the magnetization curve was performed, and a coercive force Hc was measured.

Eight types of samples, Samples 1 to 8, were prepared. Samples 2 to 8 are each corresponding to the storage element 3 according to the embodiment, and Sample 1 is a sample of Comparative Example.

The layer structure of each sample is shown in FIGS. 4A and 4B.

Samples 1 to 8 have the same structure as that shown FIG. 4A except for the oxide cap layer 18.

The underlayer 14: a laminate film of a 15-nm thick Ta film and a 10-nm thick Ru film.

The magnetization pinned layer 15: a laminate film of a 2-nm thick Co—Pt layer, a 0.7-nm thick Ru film, and a 1.2-nm thick $[Co_{20}Fe_{80}]_{70}B_{30}$ film.

The interlayer 16 (tunnel insulating layer): a 1-nm thick magnesium oxide film.

The storage layer 17: a 2-nm thick $[Co_{20}Fe_{80}]_{70}B_{30}$ film.

The structure of the oxide cap layer 18 adjacent to the storage layer 17 is shown in FIG. 4B.

Sample 1 (Comparative Example): a 0.9-nm thick magnesium oxide.

Sample 2: a 0.5-nm thick magnesium oxide and a 0.4-nm thick aluminum oxide.

Sample 3: a 0.5-nm thick magnesium oxide and a 1.0-nm thick tantalum oxide.

Sample 4: a 0.5-nm thick magnesium oxide and a 1.0-nm thick chromium oxide.

Sample 5: a 0.4-nm thick aluminum oxide and a 0.5-nm thick magnesium oxide.

Sample 6: a 1.0-nm thick tantalum oxide and a 0.5-nm thick magnesium oxide.

Sample 7: a 1.0-nm thick chromium oxide and a 0.5-nm thick magnesium oxide.

Sample 8: a 0.5-nm thick aluminum oxide and a 0.5-nm thick tantalum oxide.

In addition, on the upper part of the oxide cap layer 18 of each sample, the cap protective layer 19 (Ta, Ru, W, or the like) is laminated.

In Samples 2 to 4, magnesium oxide was used for the first cap layer 18a in contact with the storage layer 17.

In Samples 5 to 7, magnesium oxide was used for the second cap layer 18b not in contact with the storage layer 17, and a compound other than magnesium oxide was used for the first cap layer 18a.

In Sample 8, compounds other than magnesium oxide were used for the first cap layer 18a and the second cap layer 18b.

In each sample, a 300-nm thick thermally oxidized film was formed on a 0.725-mm thick silicon substrate, and the storage element having the above structure was formed the above oxidized film.

In addition, a 100-nm thick Cu film (not shown) was provided between the underlayer and the silicon substrate.

Each layer other than the interlayer 16 was formed using a DC magnetron sputtering method. The interlayer 16 using an oxide was formed such that after a metal layer was formed using an RF magnetron sputtering method or a DC magnetron sputtering method, oxidation was performed in an oxidation chamber.

After each layer forming the storage element was formed, a heat treatment was performed at 300° C. for 1 hour in an in-magnetic field heat treatment furnace.

(Measurement of Magnetization Curve)

The magnetization curve of the storage element of each sample was measured by magnetic Kerr effect measurement.

For this measurement, instead of using an element processed by microfabrication, a bulk film portion having a size of approximately 8 mm×8 mm specially provided on a wafer for magnetization curve evaluation was used. In addition, a measurement magnetic field was applied in a direction perpendicular to its film surface.

FIG. 5 shows the coercive force Hc obtained from the magnetization curve of each of Samples 1 to 8.

As for the shape of the magnetization curve relating to the cap layer, a magnetization curve having a good square shape is obtained in each structure, and the Co—Fe—B alloy forming the storage layer 17 sufficiently exhibits the perpendicular magnetic anisotropy by the interface anisotropy.

In Samples 2 to 8 in which the cap layer has a laminate structure of two oxide layers, compared to the structure using a single oxide layer as in the case of Comparative Example (Sample 1), the value of the coercive force is increased to approximately 2 times at the maximum.

The reason for this is believed that the influence of strain between the storage layer 17 and the oxide caps 18 is reduced. As is the Co—Fe—B alloy crystallized by a heat treatment and the interlayer 16 of magnesium oxide, in actual materials, a local strain is introduced into the highly oriented magnetic layer/oxide interface, and the magnetic properties are degraded.

It has been commonly understood that in particular, between a CoFe-based magnetic film and a magnesium oxide film, the mismatch in the lattice constant is large, and the influence caused by strain is also large.

It is believed that in Samples 2 to 8, since an oxide having a different mismatch is laminated in combination on a cap layer of single magnesium oxide, the strain is modulated and compensated for, and hence the magnetic properties are improved.

In addition, in Samples 2 to 8, it is believed that since the oxides having different lattice constants form the laminate structure, the compressive strain in an in-plane direction is generated in an upper or a lower portion of the laminate, and the diffusion of a Ru, a W, or a Ta layer laminated to form the cap protective layer 19 caused by a heat treatment to the oxide is suppressed.

As a result, the effect of preventing degradation of the interface anisotropy, which occurs when the diffused cap protective layer 19 is mixed with the oxide, is obtained simultaneously together with the strain compensation effect.

In addition, at least three oxide layers may be laminated in order to adjust the perpendicular magnetic anisotropy. In addition, besides the oxides shown in each sample, silicon oxide, cobalt oxide, ferrite, titanium oxide, strontium titanate, lanthanum aluminum oxide, zinc oxide, or a mixed layer containing at least one of these oxides may also be contained.

When Samples 2, 3, and 4 are compared with Samples 5, 6, and 7, the structure in which magnesium oxide is present at the interface with the storage layer 17 has approximately 1.2 times the coercive force of the structure in which no magnesium oxide is present at the interface.

Accordingly, magnesium oxide which can effectively exhibit interface anisotropy with a magnetic layer is preferably used for the first cap layer 18a located at the interface side. However, even by an oxide adjacent to the storage layer 17 other than magnesium oxide, the effect of enhancing the coercive force can also be obtained as compared to the case of the single oxide layer (Sample 1).

In addition, although the B composition of the Co—Fe—B alloy was set to 30% in the experiment, the B composition may be changed to approximately 20% to 40% in view of the TMR value and/or heat resistance.

Besides the Co—Fe—B alloy, as a magnetic material forming the storage layer 17, a Co—Fe—C alloy, a Ni—Fe—B alloy, and a Ni—Fe—C alloy may also be used.

Since addition of a non-magnetic element to the Co—Fe—B alloy of the storage layer 17 and the magnetization pinned layer 15 is also effective, as the non-magnetic element in this case, Ru, Os, Re, Ir, Au, Ag, Cu, Al, Bi, Si, B, C, Cr, Ta, Pd, Pt, Zr, Hf, W, Mo, Nb, or an alloy thereof may be used, and the magnetic properties can be adjusted thereby.

Experiment 2

This experiment evaluated the properties of the storage element 3 including the oxide cap layer 18 having a laminate structure as shown in FIG. 3. Measurement of the magnetoresistance curve and measurement of the thermal stability from the reverse current value were performed. Three types of samples, Samples 9 to 11, were prepared. Samples 10 and 11 each correspond to the storage element 3 according to the embodiment, and Sample 9 is a sample for comparison.

Figure 6A:
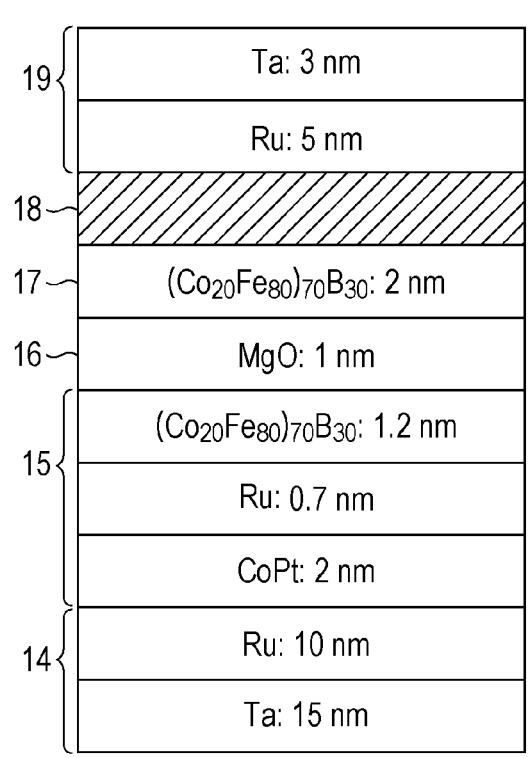
FIGS. 6A and 6B are views each illustrating a sample of Experiment 2 according to the embodiment.
Figure 6B:
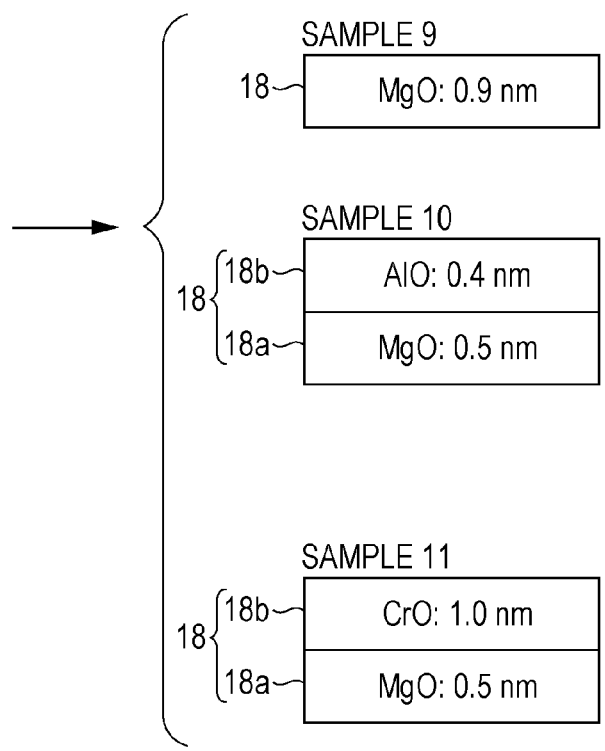

The layer structure of each sample is shown in FIGS. 6A and 6B.

Samples 9 to 11 have the same structure as that shown in FIG. 6A except for the oxide cap layer 18.

The underlayer 14: a laminate film of a 15-nm thick Ta film and a 10-nm thick Ru film.

The magnetization pinned layer 15: a laminate film of a 2-nm thick Co—Pt layer, a 0.7-nm thick Ru film, and a 1.2-nm thick $[Co_{20}Fe_{80}]_{70}B_{30}$ film.

The interlayer 16 (tunnel insulating layer): a 1-nm thick magnesium oxide film.

The storage layer 17: a 2-nm thick $[Co_{20}Fe_{80}]_{70}B_{30}$ film.

The structure of each oxide cap layer 18 adjacent to the storage layer 17 is shown in FIG. 6B.

Sample 9 (Comparative Example): a 0.9-nm thick magnesium oxide.

Sample 10: a 0.5-nm thick magnesium oxide and a 0.4-nm thick aluminum oxide.

Sample 11: a 0.5-nm thick magnesium oxide and a 1.0-nm thick chromium oxide.

In each structure, the cap protective layer 19 formed of 5-nm thick Ru and 3-nm thick Ta is formed on an upper part of the oxide cap layer 18.

In each sample, a 300-nm thick thermally oxidized film was formed on a 0.725-mm thick silicon substrate, and the above storage element was formed on the above oxidized film. In addition, a 100-nm thick Cu film (not shown, to be formed into a word line described later) was provided between the underlayer and the silicon substrate.

Each layer other than the interlayer 16 was formed using a DC magnetron sputtering method. The interlayer 16 using an oxide was formed such that after a metal layer was formed using an RF magnetron sputtering method or a DC magnetron sputtering method, oxidation was performed in an oxidation chamber.

After each layer forming the storage element was formed, a heat treatment was performed at 300° C. for 1 hour in an in-magnetic field heat treatment furnace.

Next, after a word line portion was masked by a photolithography, the word line (lower electrode) was formed by performing selective etching by Ar plasma on the laminate film at a portion other than the word line.

In this step, the portion other than the word line portion was etched to a depth of 5 nm of the substrate. Subsequently, a mask of the pattern of the storage element was formed by an electron beam exposure apparatus, and selective etching was performed to the laminate film, so that the storage element was formed.

Portions other than the storage element portion were etched right above the word line formed of a Cu layer.

In addition, since it is necessary to pass a sufficient current in a storage element for performance measurement in order to generate the spin torque necessary for magnetization reversal, the resistance of the interlayer 16 (tunnel insulating layer) has to be decreased.

Hence, the pattern of the storage element was formed to have a circular shape having a short axis of 0.07 µm and a long axis of 0.07 µm so that the sheet resistance ($\Omega/\mu m^2$) of the storage element was 20 $\Omega/\mu m^2$.

Next, the portions other than the storage element were insulated by $Al_2O_3$ having a thickness of approximately 100 nm using sputtering. Subsequently, the bit line used as an upper electrode and pads for measurement were formed using a photolithography.

As described above, each sample corresponding to the storage element 3 was formed.

Properties of each of Samples 9 to 11 of the storage elements thus formed were evaluated as described below. In order to control the reverse current so that the value thereof in a plus direction and that in a minus direction were symmetric to each other, before the measurement was performed, the structure was formed so that a magnetic field could be applied to the storage element from the outside. In addition, the voltage to be applied to the storage element was set to 1 V or less so as not to damage the insulating layer.

(Measurement of Magnetoresistance Curve (TMR Measurement))

Evaluation of the magnetoresistance curve of the storage element was performed by measuring the element resistance while a magnetic field was applied.

(Measurement of Reverse Current Value and Thermal Stability)

The reverse current value was measured in order to evaluate the write properties of the storage element 3 according to the embodiment. A current having a pulse width of 10 microseconds to 100 milliseconds was passed through the storage element, and the resistance of the storage element was then measured.

Furthermore, the current to be passed in the storage element was changed, and a current value at which the direction of the magnetization of the storage layer of this storage element was reversed was obtained.

In addition, the dispersion of the coercive force Hc obtained by measuring the magnetoresistance curve of the storage element at least two times corresponds to the index (Δ) of the retention property (thermal stability) of the storage element described above.

A higher Δ value is obtained as the dispersion of the coercive force Hc to be measured is smaller.

In addition, in order to take the variation between storage elements into consideration, after approximately 20 storage elements having the same structure were formed, the above measurement was performed, and the average of the reverse current value and that of the index Δ of thermal stability were obtained.

Evaluations of the magnetoresistance curve and the magnetization reversal properties by writing using a current of Samples 9 to 11 are shown in FIG. 7.

The TMR (tunnel magnetoresistance effect) value, the coercive force Hc, the thermal stability index Δ, and the reverse current density JcO are shown.

In Samples 10 and 11, it is found that as in the case of the comparison using the bulk film performed in Experiment 1, while the TMR (tunnel magnetoresistance effect) value and the reverse current density are maintained similar to those of Comparative Example (Sample 9), the coercive force Hc and the retention property (thermal stability index Δ) are increased to 1.1 to 1.4 times.

From these results, the advantage of the oxide cap layer 18 having a laminate structure was confirmed.

In addition, besides the structures of Samples 10 and 11, the laminate structure of the oxide cap layer may be changed within an effective range as described in Experiment 1.

In addition, by changing Ru of the cap protective layer 19 in contact with the oxide cap layer 18 to another material, the structure may be formed so as to decrease the reversal current.

As apparent from Experiments 1 and 2 described above, the storage element 3 according to this embodiment has an effect of easily manufacturing a perpendicular magnetization type MTJ, a large capacity and a low power consumption ST-MRAM storage element using the above MTJ, and a storage device using this storage element.

This technique can also take the following structure.

(1) There may be provided a storage element including a storage layer which has magnetization perpendicular to its film surface and which retains information by a magnetization state of a magnetic substance; a magnetization pinned layer having magnetization perpendicular to its film surface which is used as the basis of the information stored in the storage layer; an interlayer of a non-magnetic substance provided between the storage layer and the magnetization pinned layer; and a cap layer which is provided adjacent to the storage layer at a side opposite to the interlayer and which includes at least two oxide layers, and in this storage element, information is stored by reversing the magnetization of the storage layer using spin torque magnetization reversal generated by a current passing in a laminate direction of a layer structure including the storage layer, the interlayer, and the magnetization pinned layer.

(2) In the storage element of the above (1), the cap layer includes a layer of silicon oxide, magnesium oxide, tantalum oxide, aluminum oxide, cobalt oxide, ferrite, titanium oxide, chromium oxide, strontium titanate, lanthanum aluminum oxide, zinc oxide, or a mixture containing at least one of these oxides mentioned above.

(3) In the storage element of the above (1) or (2), of the at least two layers forming the cap layer, a layer adjacent to the storage layer is a layer of magnesium oxide.

(4) The storage element of one of the above (1) to (3), a ferromagnetic layer material forming the storage layer is Co—Fe—B.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage element comprising:
a storage layer which has magnetization perpendicular to its film surface and which retains information by a magnetization state of a magnetic substance;
a magnetization pinned layer having magnetization perpendicular to its film surface which is used as the basis of the information stored in the storage layer;
an interlayer of a non-magnetic substance provided between the storage layer and the magnetization pinned layer; and
a cap layer which is provided adjacent to the storage layer at a side opposite to the interlayer and which includes at least two oxide layers, wherein a first oxide layer adjacent to the storage layer includes magnesium oxide, and a different second oxide layer adjacent the first oxide layer includes at least one of tantalum oxide and aluminum oxide,
wherein the storage element is configured to store information by reversing the magnetization of the storage layer using spin torque magnetization reversal generated by a current passing in a laminate direction of a layer structure including the storage layer, the interlayer, and the magnetization pinned layer.

2. The storage element according to claim 1,
wherein the cap layer includes a layer of silicon oxide, magnesium oxide, tantalum oxide, aluminum oxide, cobalt oxide, ferrite, titanium oxide, chromium oxide, strontium titanate, lanthanum aluminum oxide, zinc oxide, or a mixture containing at least one of these oxides.

3. The storage element according to claim 1,
wherein the storage layer includes a ferromagnetic layer material containing Co—Fe—B.

4. A storage device comprising:
a storage element which retains information by a magnetization state of a magnetic substance; and
two types of wires intersecting each other, the storage element including a storage layer which has magnetization perpendicular to its film surface and which retains information by a magnetization state of a magnetic substance; a magnetization pinned layer having magnetization perpendicular to its film surface which is used as the basis of the information stored in the storage layer; an interlayer of a non-magnetic substance provided between the storage layer and the magnetization pinned layer; and a cap layer which is provided adjacent to the storage layer at a side opposite to the interlayer and which includes at least two oxide layers, wherein a first oxide layer adjacent to the storage layer includes magnesium oxide, and a different second oxide layer adjacent the first oxide layer includes at least one of tantalum oxide and aluminum oxide, wherein the storage element is configured to store information by reversing the magnetization of the storage layer using spin torque magnetization reversal generated by a current passing in a laminate direction of a layer structure including the storage layer, the interlayer, and the magnetization pinned layer and is arranged between the two types of wires, and the current in a laminate direction passes in the storage element through the two types of wires, so that the spin torque magnetization reversal occurs.

* * * * *